United States Patent
Chou et al.

(10) Patent No.: US 11,629,455 B2
(45) Date of Patent: Apr. 18, 2023

(54) CONDUCTIVE TEXTILE AND METHOD FOR FABRICATING THE SAME

(71) Applicant: TAIWAN TEXTILE RESEARCH INSTITUTE, New Taipei (TW)

(72) Inventors: Wei-Hao Chou, New Taipei (TW); Cheng-Liang Wu, New Taipei (TW)

(73) Assignee: TAIWAN TEXTILE RESEARCH INSTITUTE, New Taipei (TW)

( * ) Notice: Subject to any disclaimer, the term of this patent is extended or adjusted under 35 U.S.C. 154(b) by 322 days.

(21) Appl. No.: 17/076,917

(22) Filed: Oct. 22, 2020

(65) Prior Publication Data

US 2021/0332525 A1 Oct. 28, 2021

(30) Foreign Application Priority Data

Apr. 22, 2020 (TW) ................. 109113523

(51) Int. Cl.
*D06M 11/83* (2006.01)
*C08G 18/32* (2006.01)
(Continued)

(52) U.S. Cl.
CPC ......... *D06M 11/83* (2013.01); *C08G 18/3206* (2013.01); *C08G 18/48* (2013.01);
(Continued)

(58) Field of Classification Search
CPC .... B82Y 30/00; B82Y 40/00; C08G 18/3206; C08G 18/48; C08G 18/4854; C08G 18/758; C08K 2003/0806; C08K 2201/001; C08K 2201/003; C08K 2201/004; C08K 2201/011; C08K 3/08; C09D 11/102;
(Continued)

(56) References Cited

U.S. PATENT DOCUMENTS 7,968,011 B2 6/2011 Overbeek et al.
10,119,045 B2 11/2018 Kondo et al.
(Continued)

FOREIGN PATENT DOCUMENTS

CN 1632032 A 6/2005
CN 101395233 A 3/2009
(Continued)

OTHER PUBLICATIONS

Sutton Corey R, "Characterization of Resistance Change in Stretchable Silver Ink Screen Printed on TPU-Laminated Fabrics Under Cyclic Tensile Loading", Master of Science in Industrial Engineering Thesis presented to the Faculty of California Polytechnic State University San Luis Obispo, Jun. 1, 2019 (Jun. 1, 2019), XP055799629, Retrieved from the Internet: URL:https://digitalcommons.calpoly.edu/cgi/viewcontent.cgi?article=3414&context=theses [retrieved on Apr. 28, 2021].

*Primary Examiner* — Mark Kopec
*Assistant Examiner* — Jaison P Thomas
(74) *Attorney, Agent, or Firm* — McClure, Qualey & Rodack, LLP

(57) ABSTRACT

A conductive textile includes a base cloth and a conductive film disposed on the base cloth. The conductive film includes a polyurethane resin and a silver bearing conductor, in which a content of the silver bearing conductor is 55 parts by weight to 80 parts by weight, and a content of the polyurethane resin is 8 parts by weight to 12 parts by weight.

9 Claims, 3 Drawing Sheets formula (1)

(51) Int. Cl.
  *C08G 18/48* (2006.01)
  *C08K 3/08* (2006.01)
  *C09D 5/24* (2006.01)
  *D06M 15/568* (2006.01)
  *D06M 15/70* (2006.01)
  *B82Y 30/00* (2011.01)
  *B82Y 40/00* (2011.01)

(52) U.S. Cl.
  CPC .................. *C08K 3/08* (2013.01); *C09D 5/24* (2013.01); *D06M 15/568* (2013.01); *D06M 15/70* (2013.01); *B82Y 30/00* (2013.01); *B82Y 40/00* (2013.01); *C08K 2003/0806* (2013.01); *C08K 2201/001* (2013.01); *C08K 2201/003* (2013.01); *C08K 2201/004* (2013.01); *C08K 2201/011* (2013.01)

(58) Field of Classification Search
  CPC ........ C09D 11/52; C09D 175/08; C09D 5/24; D06M 11/83; D06M 15/568; D06M 15/70; D06M 23/16; D06Q 1/04; H05K 1/0283; H05K 1/038; H05K 1/095
  See application file for complete search history.

(56) References Cited

U.S. PATENT DOCUMENTS

| | | | |
|---|---|---|---|
| 2006/0265814 A1* | 11/2006 | Ritter | D06M 15/01 8/115.51 |
| 2010/0270055 A1 | 10/2010 | Zheng et al. | |
| 2010/0300618 A1 | 12/2010 | Frackmann et al. | |
| 2012/0193587 A1 | 8/2012 | Sakuraba et al. | |
| 2018/0028115 A1 | 2/2018 | Kwon | |
| 2018/0187024 A1 | 7/2018 | Sun et al. | |
| 2018/0237671 A1 | 8/2018 | Das et al. | |
| 2019/0156971 A1 | 5/2019 | Brink et al. | |
| 2020/0258655 A1 | 8/2020 | Nakao et al. | |
| 2021/0307163 A1* | 9/2021 | Lemieux | D06M 11/83 |

FOREIGN PATENT DOCUMENTS

| | | | |
|---|---|---|---|
| CN | 102040916 A | 5/2011 | |
| CN | 102040934 A | 5/2011 | |
| CN | 106436286 A | 2/2017 | |
| CN | 106634519 A | 5/2017 | |
| CN | 107522841 A | 12/2017 | |
| CN | 107734831 A | 2/2018 | |
| CN | 108511110 A | 9/2018 | |
| CN | 109385144 A | 2/2019 | |
| CN | 110922895 A | 3/2020 | |
| EP | 1284278 A2 | 2/2003 | |
| EP | 1284278 A2 * | 2/2003 | ......... C08G 18/0809 |
| GB | 1038871 A | 8/1966 | |
| TW | 200948857 A | 12/2009 | |
| TW | 201038668 A | 11/2010 | |
| TW | 201835218 A | 10/2018 | |
| TW | 202033860 A | 9/2020 | |
| WO | 2007102734 A1 | 9/2007 | |
| WO | 2012028686 A2 | 3/2012 | |
| WO | 2014153054 A1 | 9/2014 | |
| WO | 2015057505 A1 | 4/2015 | |
| WO | 2016073465 A1 | 5/2016 | |
| WO | 2016114279 A1 | 7/2016 | |
| WO | 2017170496 A1 | 10/2017 | |
| WO | 2017195400 A1 | 11/2017 | |
| WO | 2019039511 A1 | 2/2019 | |

* cited by examiner formula (1)

CONDUCTIVE TEXTILE AND METHOD FOR FABRICATING THE SAME

RELATED APPLICATIONS

This application claims priority to Taiwan Application Serial Number 109113523, filed Apr. 22, 2020, which is herein incorporated by reference.

BACKGROUND

Field of Invention

The present disclosure relates to a conductive textile, and particularly relates to a conductive textile with good elasticity and low relative resistance variation during stretching.

Description of Related Art

In recent years, with the rapid progress of technology, textiles with diverse functions have been developed to enhance the convenience of human life. For example, electronic components can be attached to textiles, and clothing made from textiles with the attached electronic components can be applied to new fields, such as smart watches, wearable pedometers, smart bracelets, etc. Furthermore, in conjunction with the prevailing trend of smart products nowadays, these electronic devices have also become the mainstream products in the consumer market. On the other hand, as these wearable electronic devices have caused huge repercussions in the consumer market, products combining electronic devices and clothing have also come out one after another.

Due to the prevalence of sports, related products are booming, and the elasticity of conductive textiles has gradually been taken seriously. However, general conductive textiles often have high relative resistance variation ($\Delta R/R_0$) due to stretching, which will affect the performance of the electronic device. Therefore, how to provide a conductive textile that can solve the above problems has gradually become an important issue for textile industry researchers.

SUMMARY

In the light of this, one of the purposes of the present disclosure is to provide a conductive textile that can solve the aforementioned problems.

In order to achieve the above purpose, the present disclosure provides a conductive textile including a base cloth and a conductive film disposed on the base cloth. The conductive film includes a polyurethane resin and a silver bearing conductor, in which a content of the silver bearing conductor is 55 parts by weight to 80 parts by weight, and a content of the polyurethane resin is 8 parts by weight to 12 parts by weight.

In some embodiments of the present disclosure, a fabricating method for the polyurethane resin includes: mixing a isocyanate and a glycerol to form an intermediate product; and mixing the intermediate product, a polyether polyol, and a catalyst to form the polyurethane resin.

In some embodiments of the present disclosure, the polyurethane resin includes a molecular structure represented by formula (1), wherein k, n1, n2, n3, n4, n5, n6, m1, and m2 are positive integers, and (k+m1+m2+4):(n1+n2+n3+n4+m1×n5+m2×n6) is between 10:5 and 10:7.

In some embodiments of the present disclosure, the silver bearing conductor includes a flake-like silver powder, and a length of a maximum major axis of the flake-like silver powder is between 2 μm and 10 μm.

In some embodiments of the present disclosure, the silver bearing conductor includes a silver nanowire, a wire diameter of the silver nanowire is between 40 nm and 160 nm, and an aspect ratio of the silver nanowire is between 100 and 1000.

In some embodiments of the present disclosure, a thickness of the conductive film is between 5 μm and 55 μm.

In some embodiments of the present disclosure, when the conductive textile is stretched to 120% of its original length, a relative resistance variation ($\Delta R/R_0$) of the conductive textile is lower than 25%.

The present disclosure provides a fabricating method for a conductive textile, including: providing a base cloth; performing a mixing step to mix a polyurethane resin, a silver bearing conductor, and an n-propanol, such that a conductive silver paste is obtained, in which a content of the silver bearing conductor is 55 parts by weight to 80 parts by weight, and a content of the polyurethane resin is 8 parts by weight to 12 parts by weight; performing a coating step to coat the conductive silver paste onto the base cloth; and performing a bake-drying step to bake and dry the base cloth undergone the coating step, such that a conductive film is formed on the base cloth.

In some embodiments of the present disclosure, wherein a content of the n-propanol is 8 parts by weight to 35 parts by weight.

In some embodiments of the present disclosure, wherein a viscosity of the conductive silver paste is between 29000 cP and 54500 cP.

In the aforementioned embodiments of the present disclosure, the conductive textile provided by the present disclosure has low relative resistance variation ($\Delta R/R_0$), so as to be suitable for sportswear. By adjusting the compositions and the composition ratio in the conductive film, the film-forming ability, conductive ability, and relative resistance variation of the conductive film can be improved. In the fabricating method for the conductive textile, the conductive silver paste is prepared by using the n-propanol as a solvent instead of a highly toxic solvent. Therefore, the conductive silver paste prepared by such a fabricating method has good bio-friendliness. In addition, the conductive silver paste prepared in the present disclosure has an appropriate viscosity, so as to facilitate the subsequent processing.

The above is only used to explain the problems to be solved, the technical means to solve the problems, the resulting effect in the present disclosure, etc. More details of the present disclosure will be described in the following embodiments and related drawings.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
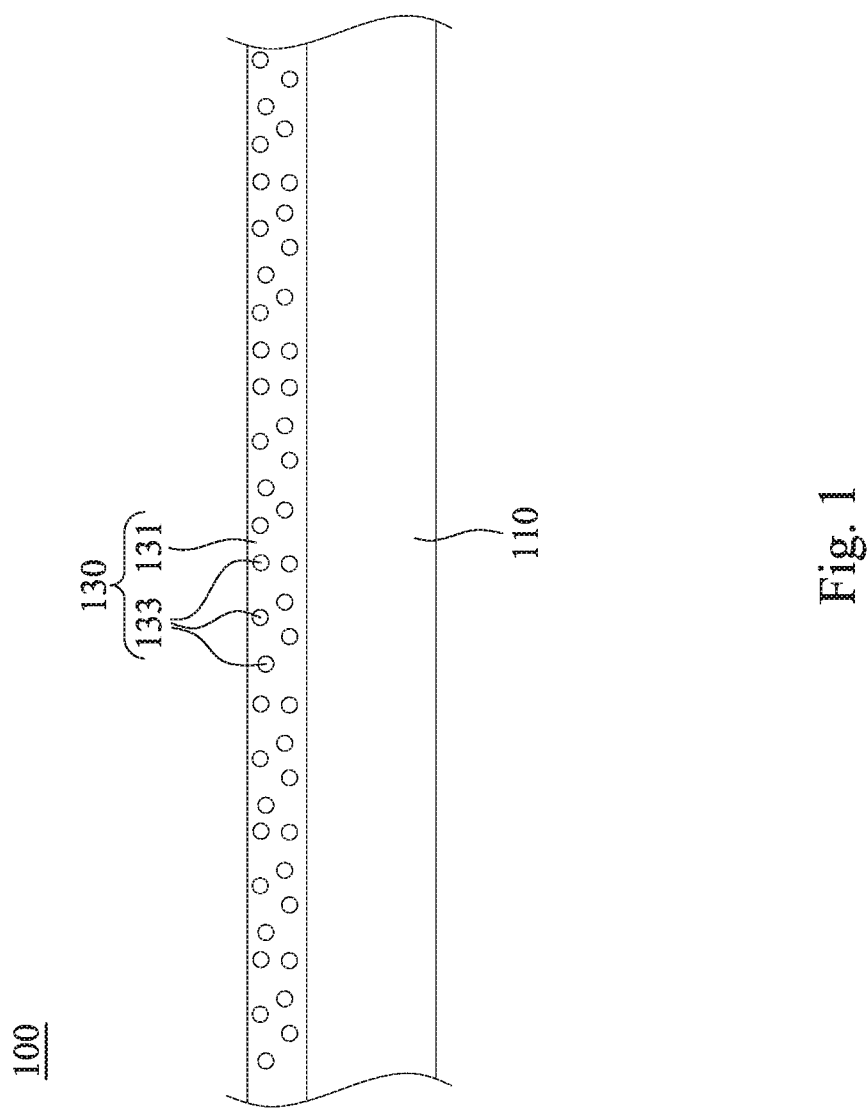
FIG. 1 is a cross-sectional view illustrating a conductive textile according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the following descriptions, the range represented by "one value to another value" is a schematic representation that avoids listing all of the values in the range one by one in the specification. Therefore, a record of a specific numerical range covers any numerical value within the numerical range and a smaller numerical range defined by any numerical value within the numerical range, and is equivalent to writing down the arbitrary value and the smaller value range in the specification.

As used herein, "around", "about", "approximately", or "substantially" shall generally mean within 30 percent, within 20 percent, within 15 percent, within 10 percent, or within 5 percent of a given value or range. Numerical quantities given herein are approximated, meaning that the term "around", "about", "approximately", or "substantially" can be inferred if not expressly stated.

The present disclosure provides a conductive textile which has low relative resistance variation ($\Delta R/R_0$) and can maintain a good conductive loop when being stretched, so as to be suitable for sportswear. Compared to the conventional techniques, the conductive film of the conductive textile provided by the present disclosure has good elasticity. In addition, the conductive silver paste in the fabricating method also has good bio-friendliness and suitable viscosity, so as to facilitate subsequent processing.

Reference is made to FIG. 1, which is a cross-sectional view illustrating a conductive textile 100 according to some embodiments of the present disclosure. The conductive textile 100 includes a base cloth 110 and a conductive film 130 disposed on the base cloth 110. In some embodiments, the base cloth 110 may be, for example, a knitted fabric, a woven fabric or a non-woven fabric, and the base cloth 110 may include polyester, nylon, cotton, polypropylene, polyurethane, or combinations thereof.

The conductive film 130 includes a polyurethane resin 131 and silver bearing conductors 133, in which the polyurethane resin 131 serve as a carrier for the silver bearing conductors 133, and the silver bearing conductors 133 serve as a main conductive medium in the conductive film 130, such that the conductive film 130 can have elasticity and conductivity at the same time. In some embodiments, a thickness of the conductive film 130 is between 5 μm and 55 μm, such that the conductive film 130 is suitable for being disposed on the base cloth 110 of the conductive textile 100 to provide the conductive textile 100 with conductivity and low relative resistance variation when being stretched. In some embodiments, when the conductive textile 100 is stretched to 120% of its original length, the relative resistance variation ($\Delta R/R_0$) of the conductive textile 100 is lower than 25%. Therefore, when the conductive textile 100 is stretched, the conductive textile 100 can still maintain low relative resistance variation and a good conductive function.

The polyurethane resin 131 serves as the carrier for the silver bearing conductors 133 to form the conductive film 130. Since the polyurethane resin 131 has good elasticity, the conductive film 130 can have good elasticity when the polyurethane resin 131 is being used to form the conductive film 130.

Figure 3:
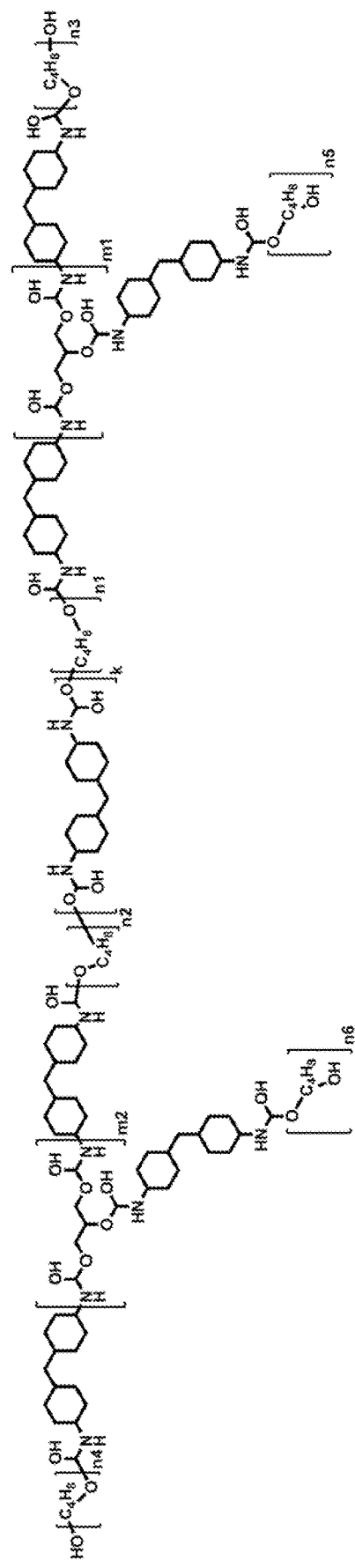
FIG. 3 is a chemical formula that shows "formula (1)" as that term is used throughout this disclosure.

In some embodiments, the polyurethane resin 131 includes a molecular structure represented by formula (1), so as to enhance the interpenetrating effect, thereby enhancing the elasticity of the conductive film 130, in which formula (1) is provided in FIG. 3, in which k, n1, n2, n3, n4, n5, n6, m1, and m2 are positive integers, and (k+m1+m2+4):(1+n2+n3+n4+m1×n5+m2×n6) is between 10:5 and 10:7. In this regard, "formula (1)" is expressly defined to mean the formula shown in FIG. 3. When the polyurethane resin 131 has the molecular structure represented by the above formula (1), the silver bearing conductors 133 can be connected in series through the dendritic structure of the polyurethane resin 131, thereby maintaining the conductivity and the low relative resistance variation when the conductive textile 100 is being stretched.

In some embodiments, a fabricating method for the polyurethane resin 131 may include: mixing a isocyanate and a glycerol to form an intermediate product; and mixing the intermediate product, a polyether polyol, and a catalyst to form the polyurethane resin 131. Specifically, the isocyanate may be, for example, dicyclohexylmethane 4,4'-diisocyanate (H12MDI); the catalyst may be, for example, dibutyltin dilaurate, dibutyltin diacetate, trifluoromethanesulfonic acid, methanesulfonic acid, diphenyl phosphate, pyridylamine, or other nitrogen heterocyclic ring such as triethylenediamine or N-heterocyclic carbene; and the polyether polyol may be, for example, polytetramethylene ether glycol (PTMEG) with a molecular weight between 2000 and 3000. In addition, the intermediate product includes a molecular structure represented by formula (2),

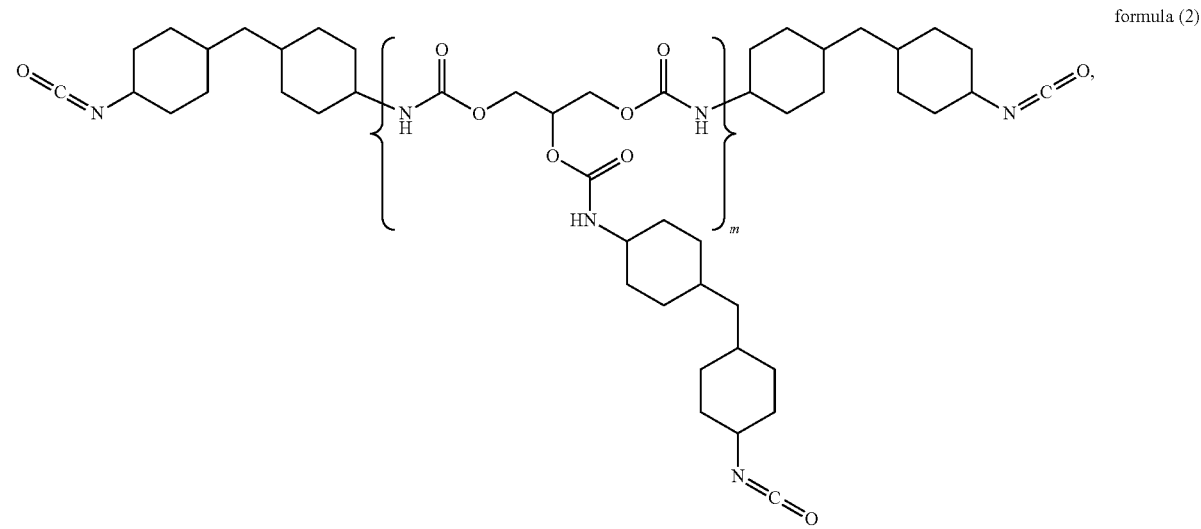

formula (2)

in which in formula (2), m is a positive integer. In some embodiments, a molar ratio of the isocyanate and the polyether polyol used to prepare the polyurethane resin 131 may be, for example, between 10:5 and 10:7, such that the (k+m1+m2+4):(n1+n2+n3+n4+m1×n5+m2×n6) in formula (1) can be between 10:5 and 10:7.

The silver bearing conductors 133 may be uniformly distributed in the polyurethane resin 131 to serve as the main conductive medium in the conductive film 130. The silver bearing conductors 133 may include silver metal powder or silver alloy powder. In some embodiments, the silver bearing conductors 133 may include flake-like silver powder, in which a length of a maximum major axis of the flake-like silver powder is between 2 µm and 10 µm, and an aspect ratio of the flake-like silver powder is lower than 1:30. In other embodiments, the silver bearing conductors 133 include silver nanowire, a wire diameter of the silver nanowire is between 40 nm and 160 nm, and an aspect ratio of the silver nanowire is between 100 and 1000. Through the above configuration, the dispersion of the silver bearing conductors 133 can be improved, which can further improve the conductivity of the conductive textile 100 and reduce the relative resistance variation of the conductive textile 100 while stretching. In addition, since the aspect ratio of the silver nanowire is significantly larger, the silver powder and the silver nanowire can be clearly distinguished by their aspect ratio.

In the conductive film 130, a content of the polyurethane resin 131 is 8 parts by weight is to 12 parts by weight, and a content of the silver bearing conductors 133 is 55 parts by weight to 80 parts by weight. If the content of the silver bearing conductors 133 is lower than 55 parts by weight, the conductive ability of the conductive film 130 is poor, thereby declining the relative resistance variation of the conductive textile 100 while stretching. In detail, since the silver bearing conductors 133 can electrically conduct with each other through physical contact, when the content of the conductive film 130 is lower than 55 parts by weight, the density of the silver bearing conductors 133 is too low to be effectively in contact, and a current interruption is occurred when the conductive textile 100 is being stretched, which in turn declines the relative resistance variation of the conductive textile 100. However, if the content of the silver bearing conductors 133 is higher than 80 parts by weight, it is difficult for the silver bearing conductors 133 to be uniformly distributed in the polyurethane resin 131, resulting in a poor film-forming property of the conductive film 130, such that the conductive film 130 is difficult to be disposed on the base cloth 110.

Figure 2:
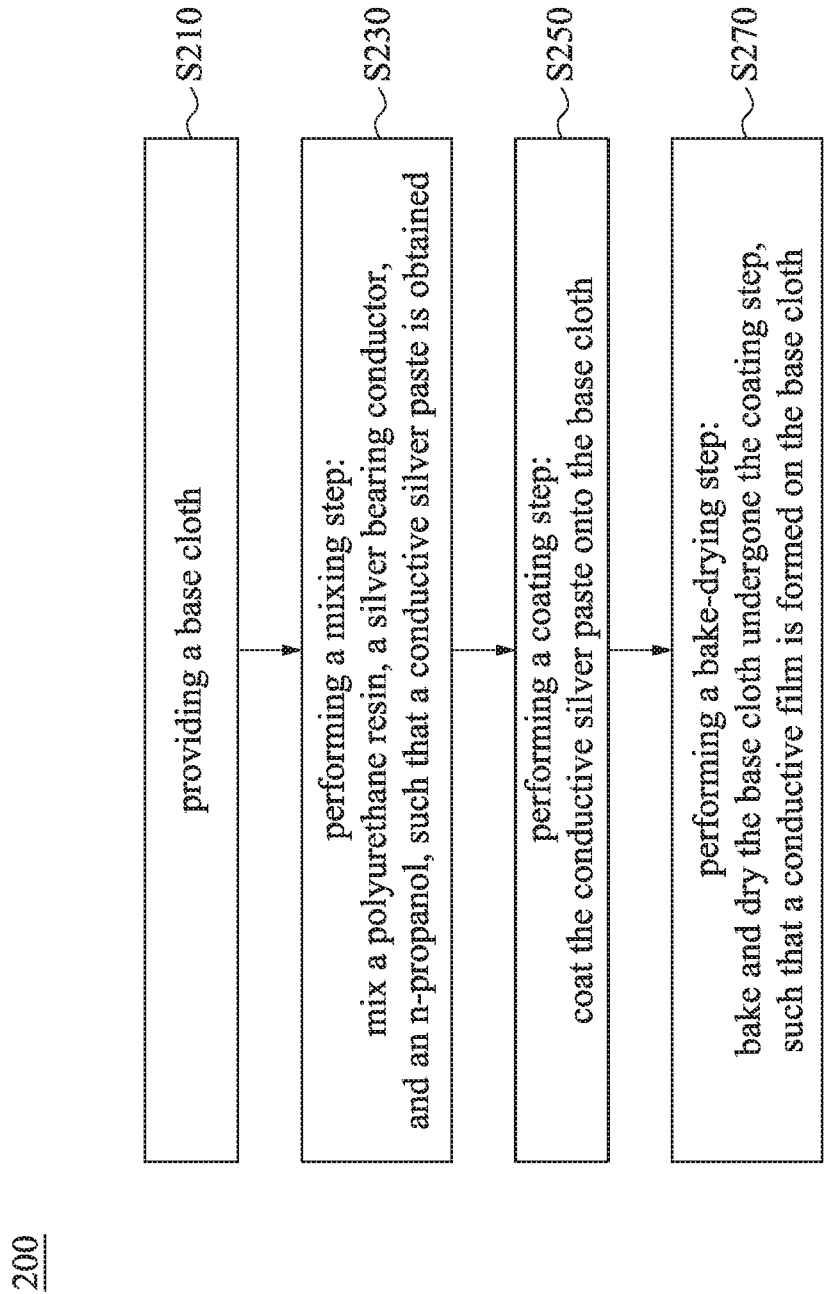
FIG. 2 is a flow chart illustrating a fabricating method for a conductive textile according to some embodiments of the present disclosure.

FIG. 2 is a flow chart illustrating a fabricating method 200 for a conductive textile according to some embodiments of the present disclosure.

Reference is made to FIG. 2. Firstly, in step S210, the base cloth is provided. The types and materials of the base cloth are as described above, which will not be repeated hereinafter.

Next, in step S230, a mixing step is performed to mix the polyurethane resin, the silver bearing conductors, and the n-propanol, such that a conductive silver paste is obtained. In some embodiments, 8 parts by weight to 12 parts by weight of the polyurethane resin, 55 parts by weight to 80 parts by weight of the silver bearing conductors, and 8 parts by weight to 35 parts by weight of the n-propanol may be mixed to obtain the conductive silver paste. The types and materials of the silver bearing conductors are as described above, which will not be repeated hereinafter. In addition, since the n-propanol is used as the solvent, the conductive silver paste of the present disclosure is environmental- and bio-friendly compared to the conventional conductive silver paste, which is prepared by the conventional fabricating process. Moreover, in some embodiments, a viscosity of the conductive silver paste obtained in step S230 may be between 29000 cP and 54500 cP, thereby being suitable for subsequent processing such as screen printing.

Next, in step S250, a coating step is performed to coat the conductive silver paste onto the base cloth. In some embodiments, the conductive silver paste may be coated on the base cloth by rod coating or screen printing, but the present disclosure is not limited in this regard.

Finally, in step S270, a bake-drying step is performed to bake and dry the base cloth which has undergone the coating step, such that the conductive film is formed on the base cloth, thereby forming the conductive textile. In some embodiments, a temperature of the bake-drying step may be between 120° C. and 160° C., but the present disclosure is not limited in this regard.

Accordingly, in steps S210 to S270, since the low-toxicity n-propanol is used as the solvent, the fabricating method for the conductive textile of the present disclosure is environmental- and bio-friendly. In addition, since a specific content of the polyurethane resin, the silver bearing conductors, and the n-propanol are used to prepare the conductive silver paste, the conductive silver paste has a specific viscosity, and hence the conductive silver paste can be formed on the base cloth by, for example, coating such as screen printing, such that the conductive textile which is suitable for various applications is obtained.

In the following descriptions, features and effects of the present disclosure will be described more specifically with reference to some embodiments and comparative examples. It is noted that without exceeding the scope of the present disclosure, the materials used, their amount and ratio, processing details, processing flow, etc. can be appropriately alternated. Therefore, the present disclosure should not be interpreted restrictively by the embodiments provided below.

<Experiment 1: Evaluation to the Influence on the Relative Resistance Variation Due to the Molar Ratio of the Compositions in the Conductive Textile>

In this experiment, the conductive textiles of the embodiments and comparative examples are fabricated by H12MDI and PTMEG with different molar ratios. Each of the conductive textiles is stretched to 150% of its original length, and the standard method of DIN 54345-1 is carried out on each of the conductive textiles by testing its conductivity with a two-point probe to measure the relative resistance variation of each of the conductive textiles. The test results are shown in Table 1.

In each of the conductive textiles shown in Table 1, the base cloth is made of thermoplastic polyurethane, the thickness of the conductive film is 50 µm, the conductive film includes 10 parts by weight of the polyurethane resin and 60 parts by weight of the flake-like silver powder, and the length of the maximum major axis of the flake-like silver powder is between 2 µm and 5 µm.

TABLE 1

| comparative examples/embodiments | H12MDI:PTMEG | relative resistance variation ($\Delta R/R_0$) |
|---|---|---|
| comparative example 1 | 20:6 | 3900% |
| comparative example 2 | 20:8 | 1500% |

TABLE 1-continued

| comparative examples/ embodiments | H12MDI:PTMEG | relative resistance variation ($\Delta R/R_0$) |
|---|---|---|
| embodiment 1 | 20:10 | 100% |
| embodiment 2 | 20:11 | 20% |
| embodiment 3 | 20:12 | 100% |
| embodiment 4 | 20:14 | 100% |

As shown in Table 1, the polyurethane resin prepared by H12MDI and PTMEG with different molar ratios affect the relative resistance variation of the conductive textile while stretching. Table 1 shows the relative resistance variation of each of the conductive textiles after being stretched to 150% of its original length. It can be seen that, compared to comparative examples 1 and 2, embodiments 1 to 4 maintain low relative resistance variation after being stretched.

<Experiment 2: Evaluation to the Influence on the Relative Resistance Variation Due to the Thickness of the Conductive Film>

In this experiment, the conductive textiles of the embodiments and comparative examples are fabricated by conductive films with different thicknesses. Each of the conductive textiles is stretched to 120% of its original length, and the standard method of DIN 54345-1 is carried out on the each of the conductive textiles by testing its conductivity with a two-point probe to measure the relative resistance variation of each of the conductive textiles. The test results are shown in Table 2.

In each of the conductive textiles shown in Table 2, the base cloth is made of thermoplastic polyurethane, the conductive film includes 10 parts by weight of the polyurethane resin and 60 parts by weight of the flake-like silver powder, the polyurethane resin is prepared by H12MDI and PTMEG with a molar ratio of 20:11, and the length of the maximum major axis of the flake-like silver powder is between 2 μm and 5 μm.

TABLE 2

| comparative examples/ embodiments | thickness of conductive film | relative resistance variation ($\Delta R/R_0$) |
|---|---|---|
| comparative example 3 | 70 μm | 42.85% |
| embodiment 5 | 52 μm | 22.22% |
| embodiment 6 | 27 μm | 18.75% |
| embodiment 7 | 10 μm | 24.00% |

As shown in Table 2, the thickness of the conductive film also affects the relative resistance variation of the conductive textile while stretching. It can be seen that, compared to comparative example 3, the thickness range of embodiments 5 to 7 can let the conductive textile to maintain low relative resistance variation after being stretched.

According to the aforementioned embodiments of the present disclosure, the relative resistance variation ($\Delta R/R_0$) of the conductive textile can be reduced by adjusting the thickness of the conductive film and its compositions. The silver bearing conductors can be connected in series through the dendritic structure of the polyurethane resin in the conductive film, thereby improving the conductivity of the conductive film and reducing the relative resistance variation. In addition, the flake-like silver powder can improve the conductivity of conductive textile, and the addition of the silver nanowire can improve the dispersion of silver powder. In the fabricating process for the conductive textile, the conductive silver paste prepared by the n-propanol instead of the conventional solvent has better bio-friendliness, and the conductive silver paste prepared therefrom has a better viscosity, so as to facilitate subsequent processing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A conductive textile comprising:
   a base cloth; and
   a conductive film disposed on the base cloth, wherein the conductive film comprises:
   a polyurethane resin; and
   a silver bearing conductor, wherein a content of the silver bearing conductor is 55 parts by weight to 80 parts by weight, a content of the polyurethane resin is 8 parts by weight to 12 parts by weight, the silver bearing conductor comprises a silver nanowire, a wire diameter of the silver nanowire is between 40 nm and 160 nm, and an aspect ratio of the silver nanowire is between 100 and 1000.

2. The conductive textile of claim 1, wherein a fabricating method for the polyurethane resin comprises:
   mixing a isocyanate and a glycerol to form an intermediate product; and
   mixing the intermediate product, a polyether polyol, and a catalyst to form the polyurethane resin.

3. The conductive textile of claim 1, wherein the polyurethane resin comprises a molecular structure represented by formula (1), wherein k, n1, n2, n3, n4, n5, n6, m1, and m2 are positive integers, and (k+m1+m2+4):(n+n2+n3+n4+m1×n5+m2×n6) is between 10:5 and 10:7.

4. The conductive textile of claim 1, wherein the silver bearing conductor comprises a flake-like silver powder, and a length of a maximum major axis of the flake-like silver powder is between 2 μm and 10 μm.

5. The conductive textile of claim 1, wherein a thickness of the conductive film is between 5 μm and 55 μm.

6. The conductive textile of claim 1, wherein when the conductive textile is stretched to 120% of its original length, a relative resistance variation of the conductive textile is lower than 25%.

7. A fabricating method for a conductive textile, comprising:
   providing a base cloth;
   performing a mixing step to mix a polyurethane resin, a silver bearing conductor, and an n-propanol, such that a conductive silver paste is obtained, wherein a content of the silver bearing conductor is 55 parts by weight to 80 parts by weight, a content of the polyurethane resin is 8 parts by weight to 12 parts by weight, the silver bearing conductor comprises a silver nanowire, a wire diameter of the silver nanowire is between 40 nm and 160 nm, and an aspect ratio of the silver nanowire is between 100 and 1000;
   performing a coating step to coat the conductive silver paste onto the base cloth; and
   performing a bake-drying step to bake and dry the base cloth undergone the coating step, such that a conductive film is formed on the base cloth.

8. The fabricating method for the conductive textile of claim 7, wherein a content of the n-propanol is 8 parts by weight to 35 parts by weight.

9. The fabricating method for the conductive textile of claim 7, wherein a viscosity of the conductive silver paste is between 29000 cP and 54500 cP.

\* \* \* \* \*